(12) United States Patent
You et al.

(10) Patent No.: US 11,189,816 B2
(45) Date of Patent: Nov. 30, 2021

(54) DISPLAY SUBSTRATE HAVING A UNITARY CATHODE LAYER CONNECTED TO A PLURALITY OF LIGHT EMITTING BLOCKS, DISPLAY APPARATUS, AND METHOD OF FABRICATING DISPLAY HAVING THE SAME

(71) Applicant: BOE Technology Group Co., Ltd., Beijing (CN)

(72) Inventors: Juanjuan You, Beijing (CN); Li Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/769,205

(22) PCT Filed: Apr. 18, 2019

(86) PCT No.: PCT/CN2019/083259
§ 371 (c)(1),
(2) Date: Jun. 2, 2020

(87) PCT Pub. No.: WO2020/211044
PCT Pub. Date: Oct. 22, 2020

(65) Prior Publication Data
US 2021/0234118 A1 Jul. 29, 2021

(51) Int. Cl.
*H01L 29/205* (2006.01)
*H01L 51/52* (2006.01)
(Continued)

(52) U.S. Cl.
CPC .......... *H01L 51/5228* (2013.01); *H01L 51/56* (2013.01); *H01L 27/3246* (2013.01)

(58) Field of Classification Search
CPC . H01L 51/5228; H01L 51/56; H01L 27/3246; H01L 27/326
See application file for complete search history.

(56) References Cited

U.S. PATENT DOCUMENTS

2006/0017375 A1 1/2006 Noguchi et al.
2009/0295309 A1* 12/2009 Kang ............... G09G 3/3426
                                                    315/297
(Continued)

FOREIGN PATENT DOCUMENTS

CN           104218182 A      12/2014

OTHER PUBLICATIONS

International Search Report & Written Opinion dated Jan. 16, 2020, regarding PCT/CN2019/083259.
(Continued)

*Primary Examiner* — Phuc T Dang
(74) *Attorney, Agent, or Firm* — Intellectual Valley Law, P.C.

(57) ABSTRACT

A display substrate includes a base substrate; a plurality of light emitting blocks on the base substrate, a respective one of the plurality of light emitting blocks in a subpixel region; a unitary cathode layer electrically connected to the plurality of light emitting blocks, the unitary cathode layer extending substantially throughout a display area of the display substrate; an organic auxiliary cathode layer electrically connected to the unitary cathode layer, the organic auxiliary cathode layer including an organic conductive polymer material; and a metallic auxiliary cathode layer limited in a groove defined by the organic auxiliary cathode layer and in direct contact with the organic auxiliary cathode layer and in direct contact with the unitary cathode layer. The metallic auxiliary cathode layer is limited in an inter-subpixel region of the display substrate. The organic auxiliary cathode layer is at least partially in the inter-subpixel region of the display substrate.

20 Claims, 12 Drawing Sheets

(51) Int. Cl.
　　　*H01L 51/56*　　　(2006.01)
　　　*H01L 27/32*　　　(2006.01)

(56) References Cited

U.S. PATENT DOCUMENTS

| | | | |
|---|---|---|---|
| 2013/0264958 A1* | 10/2013 | Yano | H05B 45/37 |
| | | | 315/193 |
| 2016/0043341 A1 | 2/2016 | Heo et al. | |
| 2016/0233451 A1 | 8/2016 | Choi et al. | |
| 2016/0284283 A1* | 9/2016 | Kurita | G09G 3/2081 |
| 2017/0077205 A1 | 3/2017 | Kim | |
| 2018/0364847 A1* | 12/2018 | Xiong | G06F 3/0443 |

OTHER PUBLICATIONS

First Office Action in the Chinese Patent Application No. 201980000500.6, dated Mar. 16, 2020; English translation attached.

\* cited by examiner

DISPLAY SUBSTRATE HAVING A UNITARY CATHODE LAYER CONNECTED TO A PLURALITY OF LIGHT EMITTING BLOCKS, DISPLAY APPARATUS, AND METHOD OF FABRICATING DISPLAY HAVING THE SAME

CROSS-REFERENCE TO RELATED APPLICATION

This application is a national stage application under 35 U.S.C. § 371 of International Application No. PCT/CN2019/083259, filed Apr. 18, 2019, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

An OLED display apparatus typically includes an anode, an organic layer including an organic light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. In a top-emission type OLED, the cathode is optically transparent, while the anode is reflective.

SUMMARY

In one aspect, the present invention provides a display substrate, comprising a base substrate; a plurality of light emitting blocks on the base substrate, a respective one of the plurality of light emitting blocks in a subpixel region; a unitary cathode layer electrically connected to the plurality of light emitting blocks, the unitary cathode layer extending substantially throughout a display area of the display substrate; an organic auxiliary cathode layer electrically connected to the unitary cathode layer, the organic auxiliary cathode layer comprising an organic conductive polymer material; and a metallic auxiliary cathode layer limited in a groove defined by the organic auxiliary cathode layer and in direct contact with the organic auxiliary cathode layer and in direct contact with the unitary cathode layer; wherein the metallic auxiliary cathode layer is limited in an inter-subpixel region of the display substrate; and the organic auxiliary cathode layer is at least partially in the inter-subpixel region of the display substrate.

Optionally, the metallic auxiliary cathode layer comprises a plurality of rows of electrode bars and a plurality of columns of electrode bars interconnected into a first network defining a plurality of first apertures, the respective one of the plurality of light emitting blocks in a respective one of the plurality of first apertures.

Optionally, the groove forms a second network comprising a plurality rows of groove lines and a plurality of columns of groove lines interconnected into the second network, a boundary of the second network defining the plurality of first apertures.

Optionally, the organic auxiliary cathode layer comprises a plurality of organic blocks, a respective one of the plurality of organic blocks in the respective one of the plurality of first apertures, a periphery of the respective one of the plurality of organic blocks in direct contact with the metallic auxiliary cathode layer.

Optionally, the organic auxiliary cathode layer is a unitary layer extending substantially throughout a display area of the display substrate; the groove extends partially into the organic auxiliary cathode layer, and the plurality of organic blocks are connected to each other through a connecting base of the organic auxiliary cathode layer.

Optionally, the plurality of organic blocks are spaced apart from each other.

Optionally, a respective one of the plurality of organic blocks has a ring structure defining a respective one of a plurality of second apertures; and the respective one of the plurality of light emitting blocks in a respective one of the plurality of second apertures.

Optionally, the organic auxiliary cathode layer and the metallic auxiliary cathode layer are on a side of the unitary cathode layer away from the base substrate; and each of the organic auxiliary cathode layer and the metallic auxiliary cathode layer is in direct contact with the unitary cathode layer.

Optionally, the organic auxiliary cathode layer and the metallic auxiliary cathode layer are between the unitary cathode layer and the base substrate; and the unitary cathode layer extends through an insulating layer between the unitary cathode layer and the metallic auxiliary cathode layer to connect with the metallic auxiliary cathode layer.

Optionally, the organic auxiliary cathode layer is limited in the inter-subpixel region.

Optionally, the organic auxiliary cathode layer is partially in the inter-subpixel region and partially in the subpixel region.

Optionally, the organic auxiliary cathode layer spans substantially throughout the subpixel region.

Optionally, the display substrate further comprises an insulating layer on the base substrate; and an anode layer comprising a plurality of anodes on a side of the insulating layer away from the base substrate, a respective one of the plurality of anodes connected to the respective one of the plurality of light emitting blocks in the subpixel region; wherein the organic auxiliary cathode layer and the metallic auxiliary cathode layer are on a side of the insulating layer away from the base substrate; each of the anode layer, the organic auxiliary cathode layer, and the metallic auxiliary cathode layer is in direct contact with the insulating layer; and the anode layer, the organic auxiliary cathode layer, and the metallic auxiliary cathode layer are on a same plane of the insulating layer.

Optionally, the organic auxiliary cathode layer is a substantially transparent layer.

Optionally, the organic conductive polymer material comprises a polymer comprising a hydrophobic group.

Optionally, the organic conductive polymer material is selected from a group consisting of polyacetylene, polythiophene, polypyrrole, polyaniline, polyphenylene, polyphenylene ethylene, and polydiacetylene.

Optionally, the metallic auxiliary cathode layer comprises nano-silver.

In another aspect, the present invention provides a display apparatus, comprising the display substrate described herein or fabricated by a method described herein, and one or more integrated circuits connected to the display substrate.

In another aspect, the present invention provides a method of fabricating a display substrate, comprising forming a plurality of light emitting blocks on a base substrate, a respective one of the plurality of light emitting blocks formed in a subpixel region; forming a unitary cathode layer electrically connected to the plurality of light emitting blocks, the unitary cathode layer formed to extend substantially throughout a display area of the display substrate; forming an organic auxiliary cathode layer electrically connected to the unitary cathode layer, the organic auxiliary cathode layer formed to comprise an organic conductive polymer material; and forming a metallic auxiliary cathode layer limited in a groove defined by the organic auxiliary cathode layer and in direct contact with the organic auxiliary cathode layer and in direct contact with the unitary cathode layer, wherein the metallic auxiliary cathode layer is formed to be limited in an inter-subpixel region of the display substrate; and the organic auxiliary cathode layer is formed to be at least partially in the inter-subpixel region of the display substrate.

Optionally, the metallic auxiliary cathode layer is formed by ink-jet printing, imprinting, or screen printing.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
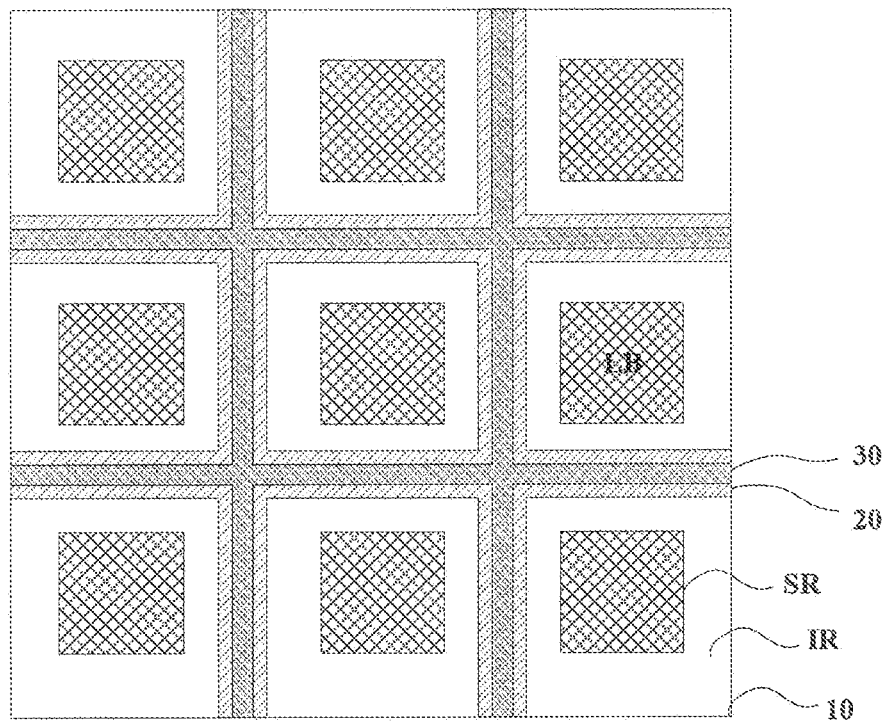
FIG. 1A is a plan view of a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In organic light emitting diode display panel, a layer of cathode is deposited in an open mask process on the display panel. Thus, an IR drop exists across different regions of the cathode across the display panel. In order to enhance light transmittance, typically the cathode is made as a thin layer, increasing the resistance of the cathode. The increase in the IR drop leads to non-uniformity of voltage levels across various regions of the cathode, resulting in non-uniformity of display illuminance in the display panel. In some embodiments, an auxiliary cathode made of a highly conductive material is formed to obviate the IR drop issue. Typically, the auxiliary cathode is made of nano-silver and typically formed in a wet process such as ink-jet printing, imprinting, or screen printing using a nano-silver ink. It is discovered in the present disclosure that the nano-silver ink is difficult to handle, particularly, it is very difficult to control the contact angle of the nano-silver ink on the display substrate. When the nano-silver ink is low polar, it easily spread out on a surface of the display substrate, resulting in a relatively large line width. When the nano-silver ink is high polar, it is prone to glomeration, leading to line open.

Accordingly, the present disclosure provides, inter alia, a display substrate, a display apparatus, and a method of fabricating a display substrate that substantially obviate one or more of the problems due to limitations and disadvantages of the related art. In one aspect, the present disclosure provides a display substrate. In some embodiments, the display substrate includes a base substrate; a plurality of light emitting blocks on the base substrate, a respective one of the plurality of light emitting blocks in a subpixel region; a unitary cathode layer electrically connected to the plurality of light emitting blocks, the unitary cathode layer extending substantially throughout the display substrate; an organic auxiliary cathode layer electrically connected to the unitary cathode layer, the organic auxiliary cathode layer comprising an organic conductive polymer material; and a metallic auxiliary cathode layer limited in a groove defined by the organic auxiliary cathode layer and in direct contact with the organic auxiliary cathode layer and in direct contact with the unitary cathode layer. Optionally, the metallic auxiliary cathode layer is limited in an inter-subpixel region of the display substrate. Optionally, the organic auxiliary cathode layer is at least partially in the inter-subpixel region of the display substrate. The present display substrate obviates the IR drop issue by having the metallic auxiliary cathode layer and the organic auxiliary cathode layer connected to the unitary cathode layer. The metallic auxiliary cathode layer is limited in the groove defined by the organic auxiliary cathode layer, thus a relatively small line width can be achieved, at the same time obviating the glomeration phenomenon and the line open issue. Moreover, the present display substrate maintains a relatively high light transmittance.

As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light emitting block in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

As used herein, the term "substantially throughout" refers to throughout at least 50% (e.g., at least 60%, at least 70%, at least 80%, at least 90%, at least 95%, at least 99%, or 100%) of a region.

Figure 2:
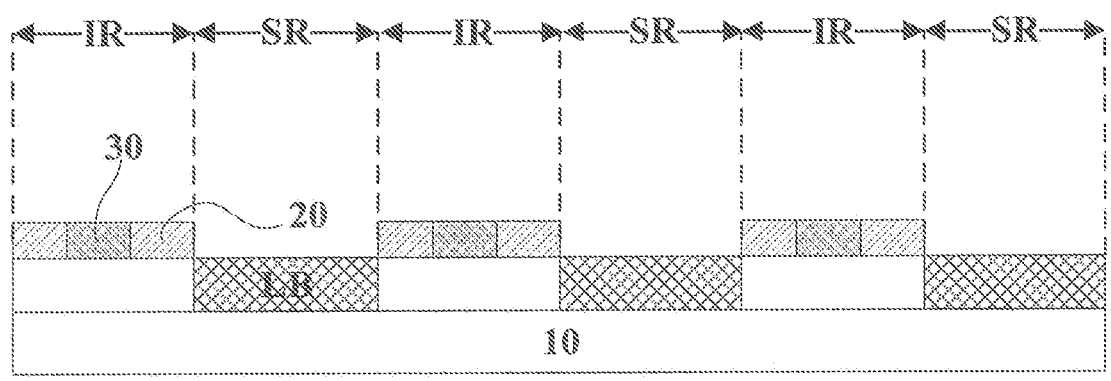
FIG. 2 is a cross-sectional view of a display substrate in some embodiments according to the present disclosure.
Figure 3:
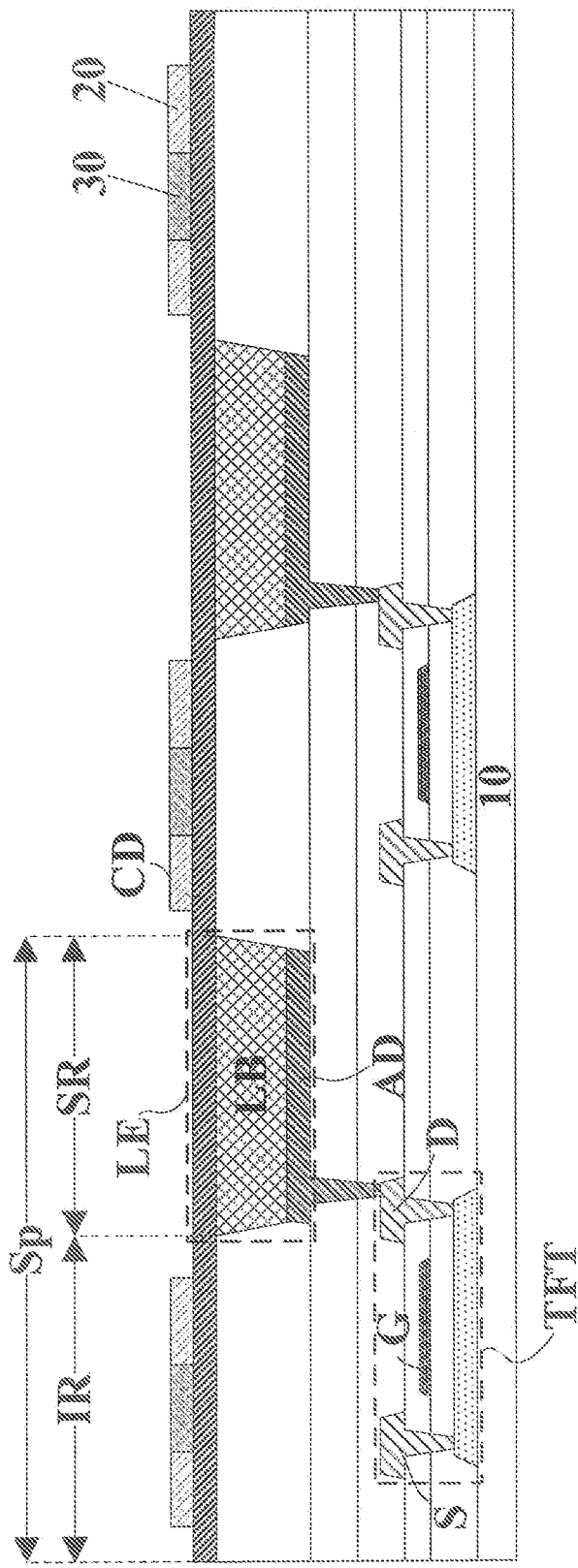
FIG. 3 is a cross-sectional view of a display substrate in some embodiments according to the present disclosure.

FIG. 1A is a plan view of a display substrate in some embodiments according to the present disclosure. FIG. 2 is a cross-sectional view of a display substrate in some embodiments according to the present disclosure. FIG. 3 is a cross-sectional view of a display substrate in some embodiments according to the present disclosure. Referring to FIG. 1A, the display substrate in some embodiments includes a base substrate 10, and a plurality of light emitting blocks LB on the base substrate 10. A respective one of the plurality of light emitting blocks LB is in a subpixel region SR. Referring to FIG. 3, the display substrate in some embodiments further includes a unitary cathode layer CD electrically connected to the plurality of light emitting blocks LB. The unitary cathode layer CD extends substantially throughout a display area of the display substrate. As used herein, the term "display area" refers to an area of the display substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

Referring to FIG. 3, the display substrate includes a plurality of subpixels Sp, each of which includes a respective one of a plurality of light emitting elements LE. The respective one of the plurality of light emitting elements LE includes a respective one of a plurality of anodes AD, a respective one of the plurality of light emitting blocks LB, and the unitary cathode layer CD for providing a common voltage. Further, the display substrate includes a plurality of thin film transistors TFT respectively in the plurality of subpixels Sp and on the base substrate 10. A respective one of the plurality of thin film transistors TFT includes a gate electrode G, a source electrode S, and a drain electrode D. The drain electrode D is connected to the respective one of the plurality of anodes AD for driving light emission in the respective one of the plurality of light emitting elements LE.

Referring to FIG. 1A, FIG. 2, and FIG. 3, the display substrate in some embodiments further includes an organic auxiliary cathode layer 20 electrically connected to the unitary cathode layer CD, and a metallic auxiliary cathode layer 30 electrically connected to the unitary cathode layer CD. The organic auxiliary cathode layer 20 is made of an organic conductive polymer material. The metallic auxiliary cathode layer 30 is made of a metallic material. Optionally, the metallic auxiliary cathode layer 30 is in direct contact with the organic auxiliary cathode layer 20 and in direct contact with the unitary cathode layer CD. Optionally, the metallic auxiliary cathode layer 30 is limited in an inter-subpixel region IR of the display substrate. Optionally, the organic auxiliary cathode layer 20 is at least partially in the inter-subpixel region IR of the display substrate. In one example, as shown in FIG. 1A, FIG. 2, and FIG. 3, the organic auxiliary cathode layer 20 is limited in the inter-subpixel region IR of the display substrate.

Figure 1B:
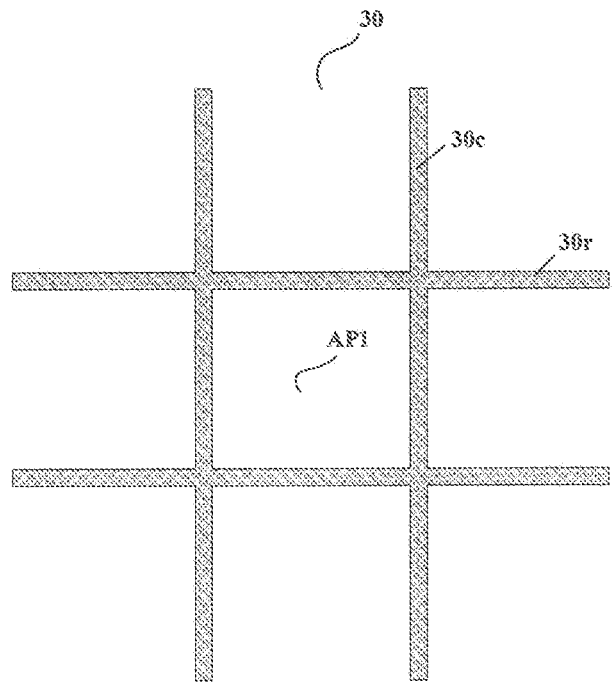
FIG. 1B is a plan view of a metallic auxiliary cathode layer in some embodiments according to the present disclosure.

FIG. 1B is a plan view of a metallic auxiliary cathode layer in some embodiments according to the present disclosure. Referring to FIG. 1B, the metallic auxiliary cathode layer 30 in some embodiments includes a plurality of rows of electrode bars 30r and a plurality of columns of electrode bars 30c interconnected into a first network defining a plurality of first apertures AP1. A respective one of the plurality of light emitting blocks LB is in a respective one of the plurality of first apertures AP1.

Figure 1C:
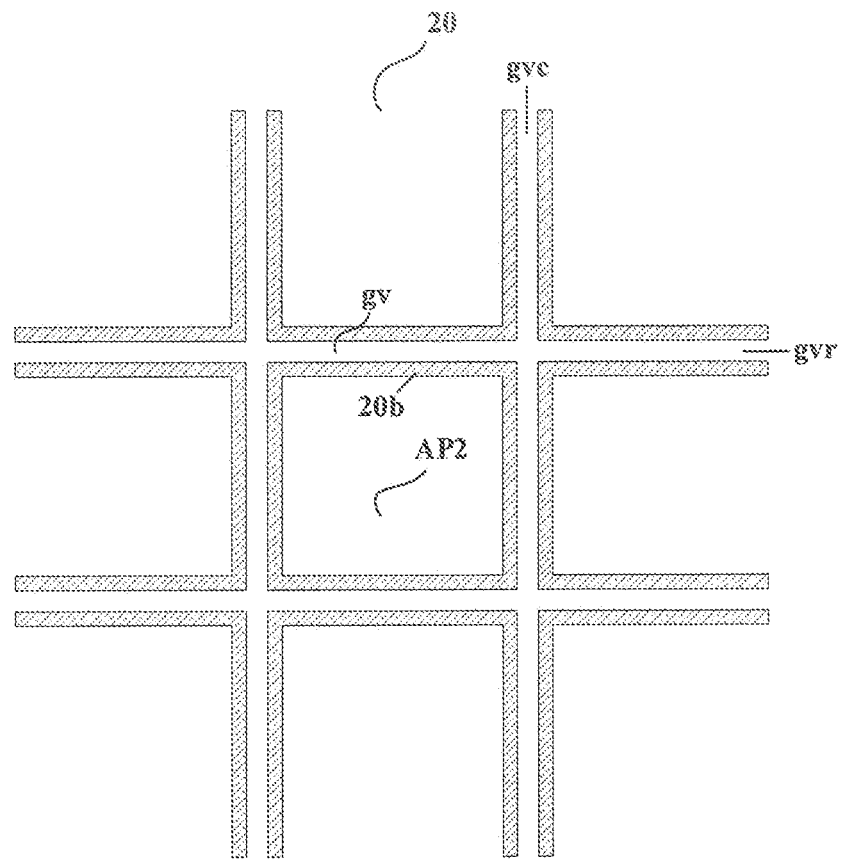
FIG. 1C is a plan view of an organic auxiliary cathode layer in some embodiments according to the present disclosure.

FIG. 1C is a plan view of an organic auxiliary cathode layer in some embodiments according to the present disclosure. Referring to FIG. 1C, the organic auxiliary cathode layer 20 in some embodiments defines a groove gv. Referring to FIG. 1A, FIG. 1B, FIG. 1C, FIG. 2, and FIG. 3, the metallic auxiliary cathode layer 30 in some embodiments is limited in the groove gv defined by the organic auxiliary cathode layer 20. As shown in FIG. 1C, the groove gv forms a second network having a plurality rows of groove lines gvr and a plurality of columns of groove lines gvc interconnected into the second network. Referring to FIGS. 1A to 1C, optionally, a boundary of the second network defines the plurality of first apertures AP1.

Referring to FIG. 1C again, in some embodiments, the organic auxiliary cathode layer 20 includes a plurality of organic blocks 20b. Optionally, a respective one of the plurality of organic blocks 20b is in the respective one of the plurality of first apertures AP1. A periphery of the respective one of the plurality of organic blocks 20b is in direct contact with the metallic auxiliary cathode layer 30.

In some embodiments, as shown in FIG. 1A and FIG. 1C, the plurality of organic blocks 20b are spaced apart from each other. Optionally, a respective one of the plurality of organic blocks 20b has a ring structure defining a respective one of a plurality of second apertures AP2. Optionally, a respective one of the plurality of light emitting blocks LB is in a respective one of the plurality of second apertures AP2.

Referring to FIG. 3, in some embodiments, the organic auxiliary cathode layer 20 and the metallic auxiliary cathode layer 30 are on a side of the unitary cathode layer CD away from the base substrate 10. Optionally, at least one of the organic auxiliary cathode layer 20 and the metallic auxiliary cathode layer 30 is in direct contact with the unitary cathode layer CD. As shown in FIG. 3, in some embodiments, each of the organic auxiliary cathode layer 20 and the metallic auxiliary cathode layer 30 is in direct contact with the unitary cathode layer CD. Optionally, the organic auxiliary cathode layer 20 and the metallic auxiliary cathode layer 30 are on a same plane of the unitary cathode layer CD.

Figure 4:
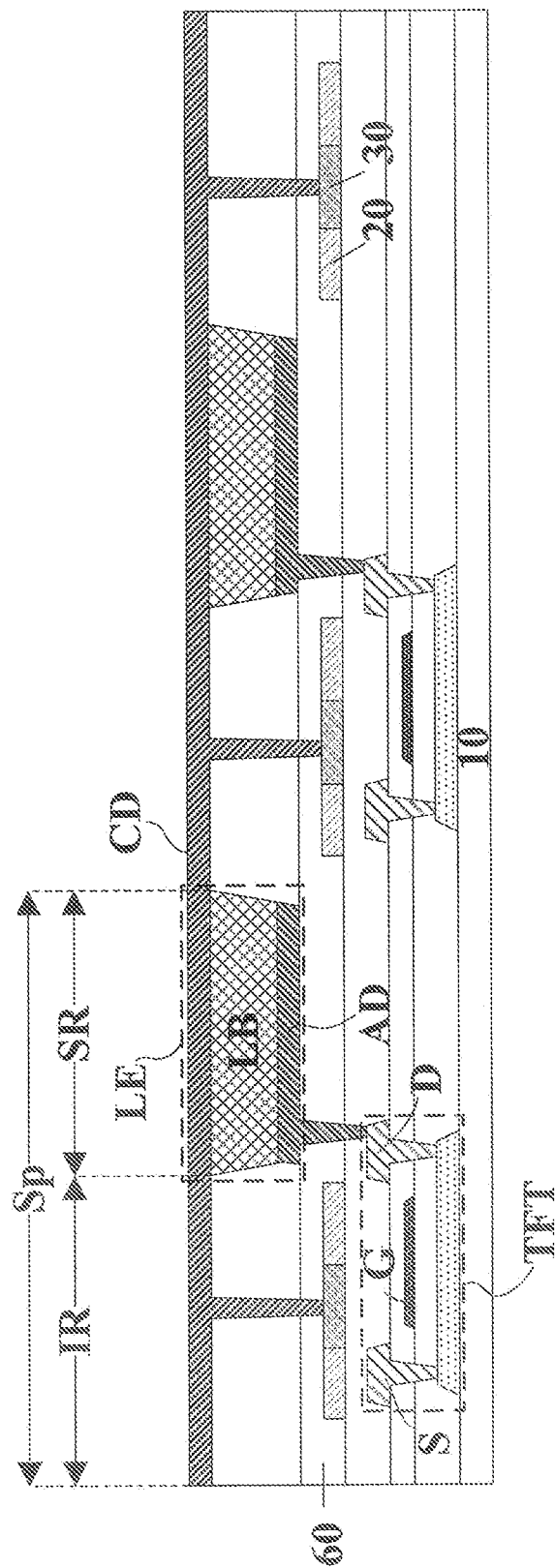
FIG. 4 is a cross-sectional view of a display substrate in some embodiments according to the present disclosure.

FIG. 4 is a cross-sectional view of a display substrate in some embodiments according to the present disclosure. Referring to FIG. 4, in some embodiments, the organic auxiliary cathode layer 20 and the metallic auxiliary cathode layer 30 are between the unitary cathode layer CD and the base substrate 10. Optionally, the unitary cathode layer CD extends through at least an insulating layer 60 between the unitary cathode layer CD and the metallic auxiliary cathode layer 30 to connect with the metallic auxiliary cathode layer 30. Optionally, the unitary cathode layer CD extends through at least the insulating layer 60 between the unitary cathode layer CD and the organic auxiliary cathode layer 20 to connect with the organic auxiliary cathode layer 20. Optionally, the unitary cathode layer CD is in direct contact with the metallic auxiliary cathode layer 30. Optionally, the unitary cathode layer CD is in direct contact with the organic auxiliary cathode layer 20.

Figure 5:
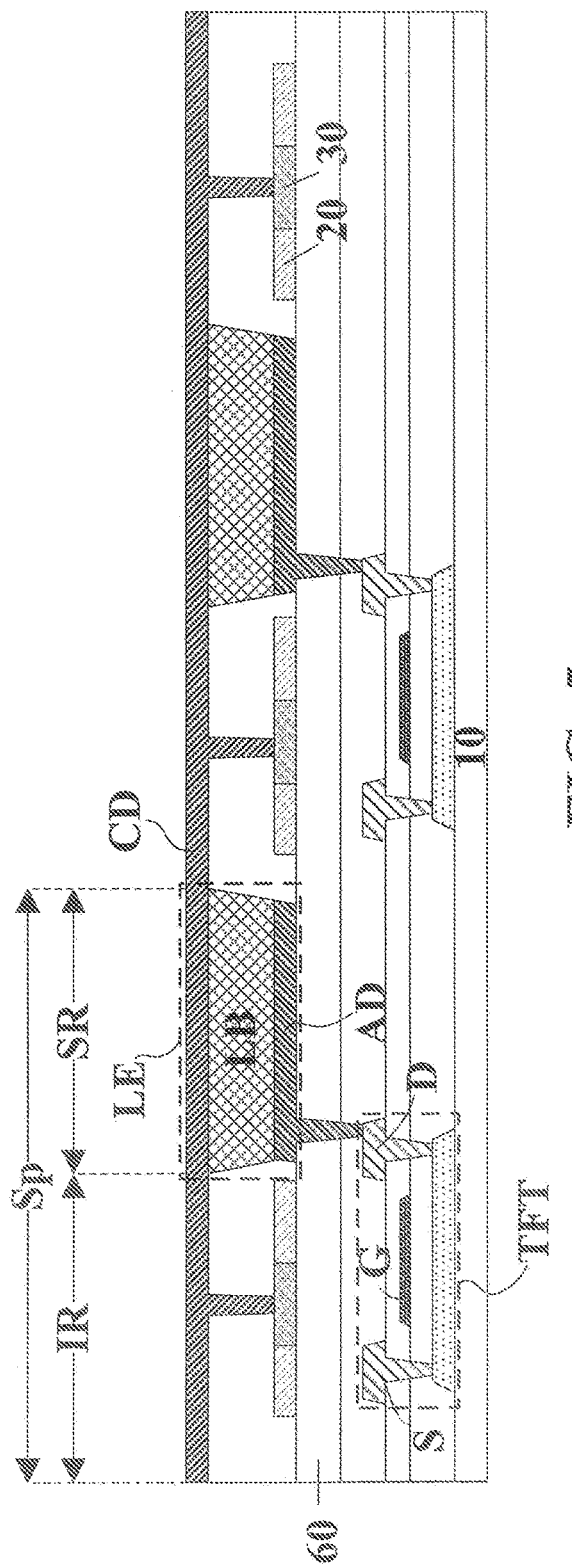
FIG. 5 is a cross-sectional view of a display substrate in some embodiments according to the present disclosure.

FIG. 5 is a cross-sectional view of a display substrate in some embodiments according to the present disclosure. Referring to FIG. 5, the display substrate includes an insulating layer 60 on the base substrate 10; and an anode layer including a plurality of anodes AD on a side of the insulating layer 60 away from the base substrate 10. A respective one of the plurality of anodes AD is connected to the respective one of the plurality of light emitting blocks LB in the subpixel region SR. Optionally, the organic auxiliary cathode layer 20 and the metallic auxiliary cathode layer 30 are on a side of the insulating layer 60 away from the base substrate 10. Optionally, each of the anode layer (including the plurality of anodes AD), the organic auxiliary cathode layer 20, and the metallic auxiliary cathode layer 30 is in direct contact with the insulating layer 60. Optionally, the anode layer, the organic auxiliary cathode layer 20, and the metallic auxiliary cathode layer 30 are on a same plane of the insulating layer 60.

In some embodiments, and referring to FIGS. 3 to 5, orthographic projections of the organic auxiliary cathode layer 20 and the metallic auxiliary cathode layer 30 on the base substrate 10 at least partially overlap with an orthographic projection of a respective one of the plurality of thin film transistors TFT on the base substrate 10. Optionally, the orthographic projections of the organic auxiliary cathode layer 20 and the metallic auxiliary cathode layer 30 on the base substrate 10 cover orthographic projections of the plurality of thin film transistors TFT on the base substrate 10. Optionally, an orthographic projection of the organic auxiliary cathode layer 20 on the base substrate 10 at least partially overlap with the orthographic projection of the respective one of the plurality of thin film transistors TFT on the base substrate 10. Optionally, an orthographic projection of the metallic auxiliary cathode layer 30 on the base substrate 10 at least partially overlap with the orthographic projection of the respective one of the plurality of thin film transistors TFT on the base substrate 10.

In some embodiments, and referring to FIGS. 3 to 5, the organic auxiliary cathode layer 20 is limited in the inter-subpixel region IR.

Figure 6A:
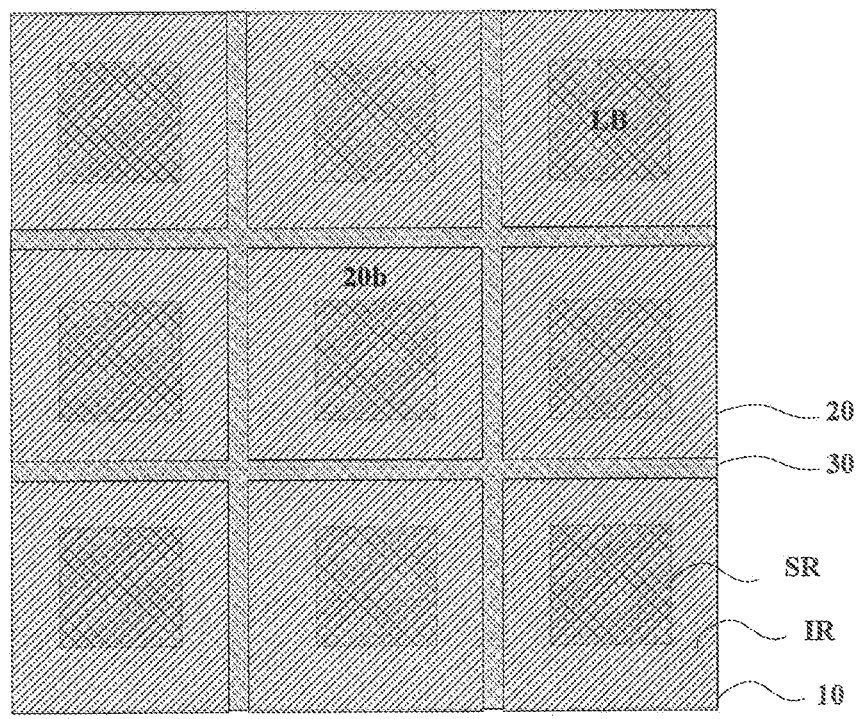
FIG. 6A is a plan view of a display substrate in some embodiments according to the present disclosure.
Figure 7A:
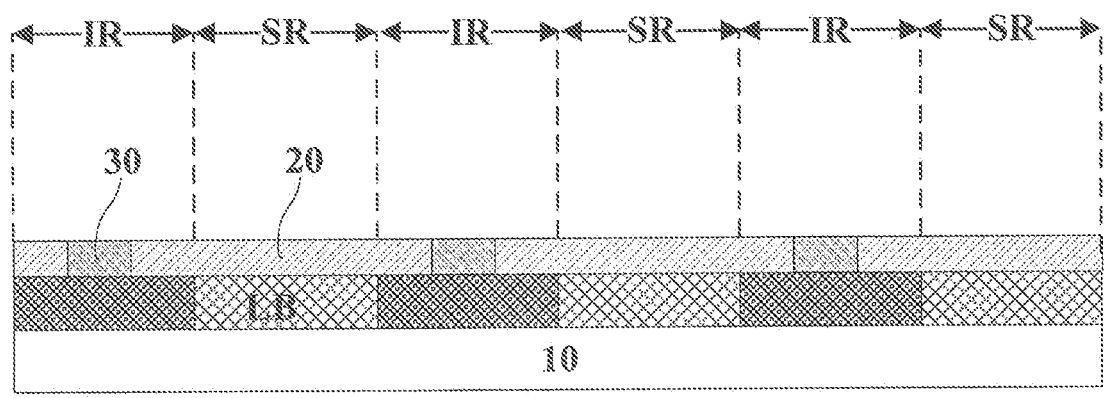
FIG. 7A is a cross-sectional view of a display substrate in some embodiments according to the present disclosure.

FIG. 6A is a plan view of a display substrate in some embodiments according to the present disclosure. FIG. 7A is a cross-sectional view of a display substrate in some embodiments according to the present disclosure. Referring to FIG. 6A and FIG. 7A, in some embodiments, the organic auxiliary cathode layer 20 is partially in the inter-subpixel region IR and partially in the subpixel region SR. In the exemplary embodiments illustrated in FIG. 6A and FIG. 7A, the organic auxiliary cathode layer 20 spans substantially throughout the subpixel region SR. Specifically, the display substrate includes an organic auxiliary cathode layer 20 electrically connected to the unitary cathode layer CD, and a metallic auxiliary cathode layer 30 electrically connected to the unitary cathode layer CD. The organic auxiliary cathode layer 20 is made of an organic conductive polymer material. The metallic auxiliary cathode layer 30 is made of a metallic material. Optionally, the metallic auxiliary cathode layer 30 is in direct contact with the organic auxiliary cathode layer 20 and in direct contact with the unitary cathode layer CD. Optionally, the metallic auxiliary cathode layer 30 is limited in an inter-subpixel region IR of the display substrate. Optionally, the organic auxiliary cathode layer 20 is partially in the inter-subpixel region IR and partially in the subpixel region SR.

Figure 6B:
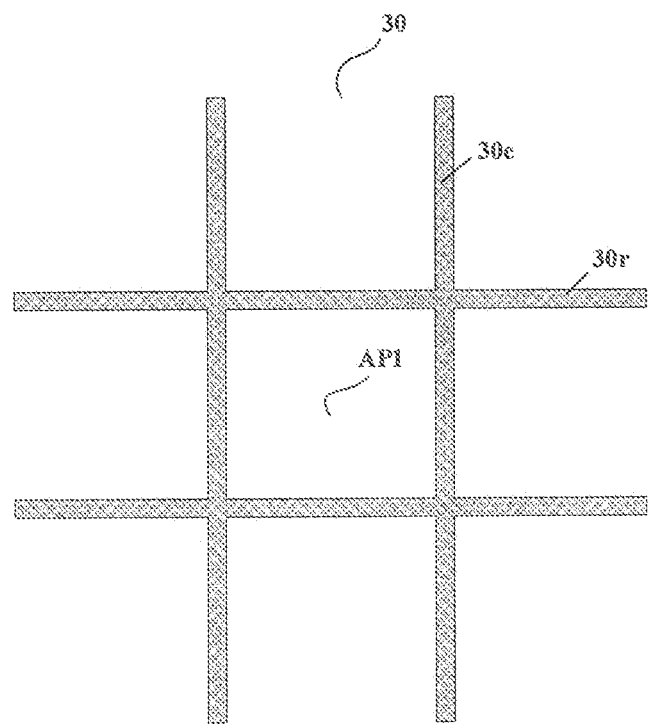
FIG. 6B is a plan view of a metallic auxiliary cathode layer in some embodiments according to the present disclosure.

FIG. 6B is a plan view of a metallic auxiliary cathode layer in some embodiments according to the present disclosure. Referring to FIG. 6B, the metallic auxiliary cathode layer 30 in some embodiments includes a plurality of rows of electrode bars 30r and a plurality of columns of electrode bars 30c interconnected into a first network defining a plurality of first apertures AP1. A respective one of the plurality of light emitting blocks LB is in a respective one of the plurality of first apertures AP1.

Figure 6C:
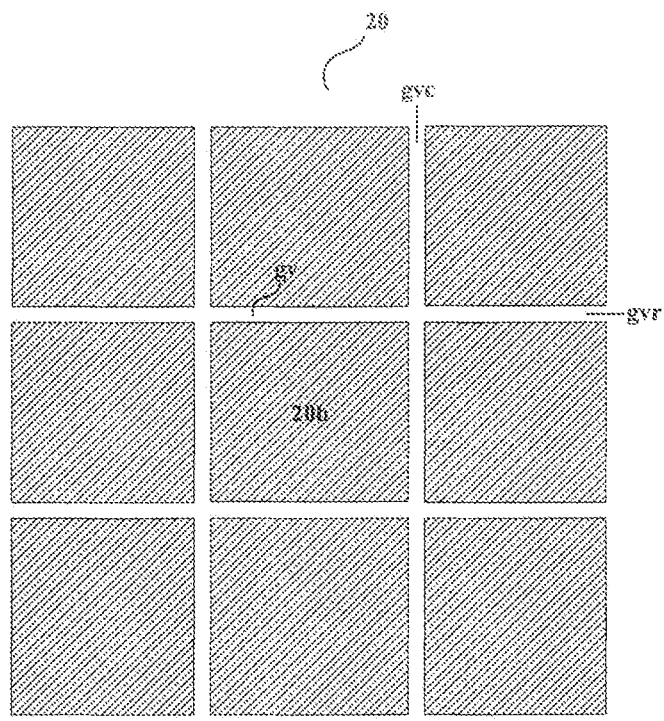
FIG. 6C is a plan view of an organic auxiliary cathode layer in some embodiments according to the present disclosure.
Figure 7B:
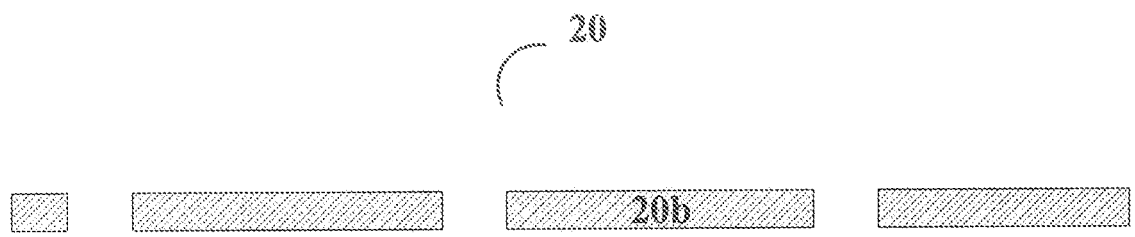
FIG. 7B is a cross-sectional view of an organic auxiliary cathode layer in some embodiments according to the present disclosure.

FIG. 6C is a plan view of an organic auxiliary cathode layer in some embodiments according to the present disclosure. FIG. 7B is a cross-sectional view of an organic auxiliary cathode layer in some embodiments according to the present disclosure. Referring to FIG. 6C, the organic auxiliary cathode layer 20 in some embodiments defines a groove gv. Referring to FIGS. 6A to 6C, the metallic auxiliary cathode layer 30 in some embodiments is limited in the groove gv defined by the organic auxiliary cathode layer 20. As shown in FIG. 6C, the groove gv forms a second network having a plurality rows of groove lines gvr and a plurality of columns of groove lines gvc interconnected into the second network. Referring to FIGS. 6A to 6C, optionally, a boundary of the second network defines the plurality of first apertures AP1. Referring to FIG. 6C and FIG. 7B, the organic auxiliary cathode layer 20 includes a plurality of organic blocks 20b. Optionally, a respective one of the plurality of organic blocks 20b is in the respective one of the plurality of first apertures AP1. A periphery of the respective one of the plurality of organic blocks 20b is in direct contact with the metallic auxiliary cathode layer 30. Optionally, the plurality of organic blocks 20b are spaced apart from each other. As shown in FIG. 6A and FIG. 6C, a respective one of the plurality of organic blocks 20b covers a respective one of the plurality of light emitting blocks LB.

Figure 6D:
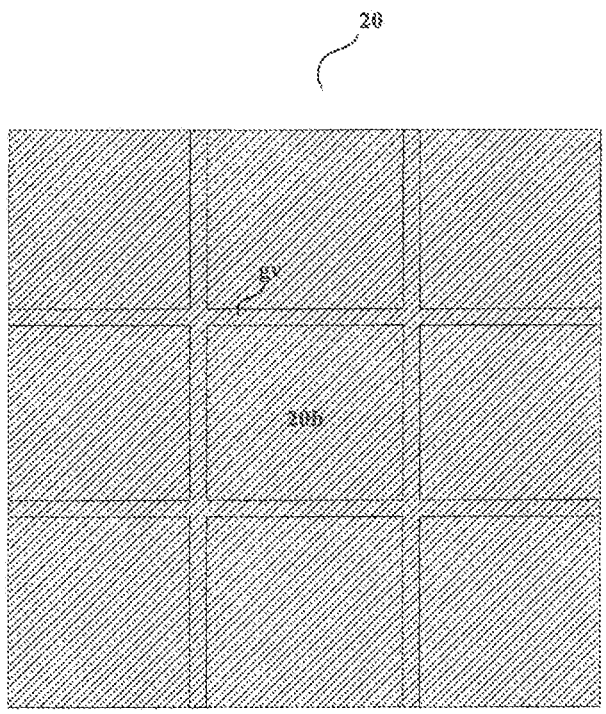
FIG. 6D is a plan view of an organic auxiliary cathode layer in some embodiments according to the present disclosure.
Figure 7C:
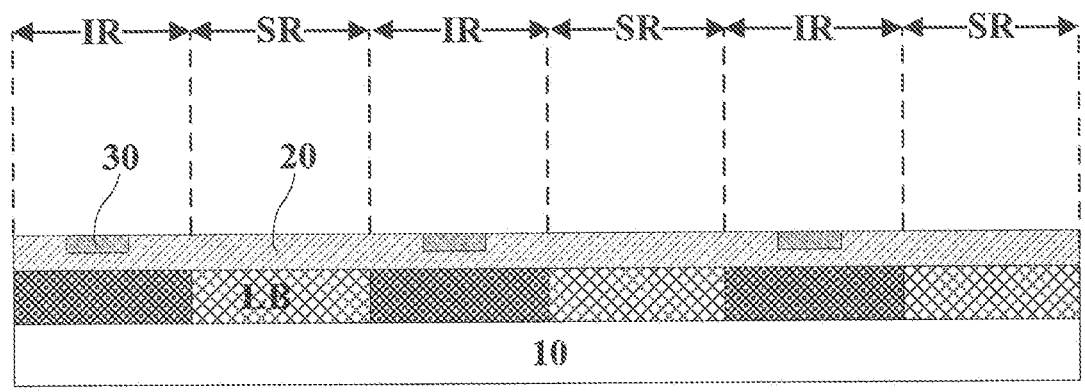
FIG. 7C is a cross-sectional view of a display substrate in some embodiments according to the present disclosure.
Figure 7D:
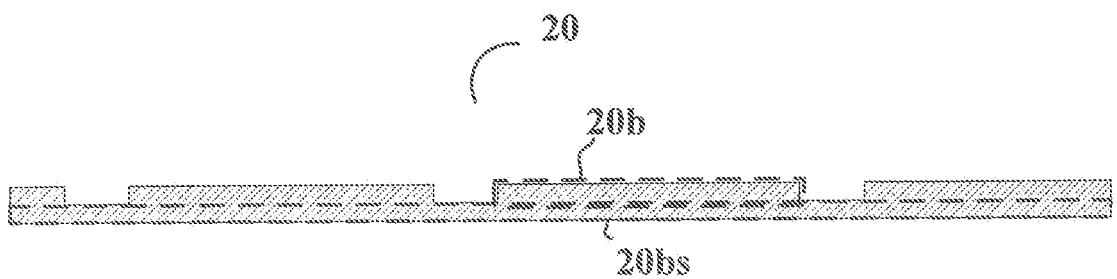
FIG. 7D is a cross-sectional view of an organic auxiliary cathode layer in some embodiments according to the present disclosure.

FIG. 6D is a plan view of an organic auxiliary cathode layer in some embodiments according to the present disclosure. FIG. 7C is a cross-sectional view of a display substrate in some embodiments according to the present disclosure. FIG. 7D is a cross-sectional view of an organic auxiliary cathode layer in some embodiments according to the present disclosure. Referring to FIG. 6D, FIG. 7C, and FIG. 7D, in some embodiments, the organic auxiliary cathode layer 20 is a unitary layer extending substantially throughout a display area of the display substrate. The groove gv extends partially into the organic auxiliary cathode layer 20. The plurality of organic blocks 20b are connected to each other through a connecting base 20bs of the organic auxiliary cathode layer 20. As shown in FIG. 7C, an orthographic projection of the organic auxiliary cathode layer 20 on the base substrate 10 substantially covers orthographic projections of the plurality of light emitting blocks LB on the base substrate 10.

Figure 6E:
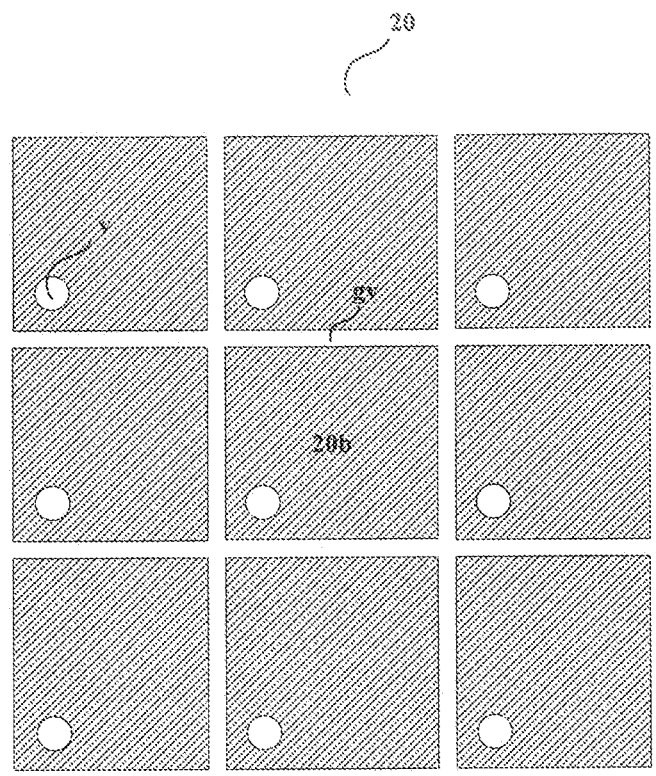
FIG. 6E is a plan view of an organic auxiliary cathode layer in some embodiments according to the present disclosure.

FIG. 6E is a plan view of an organic auxiliary cathode layer in some embodiments according to the present disclosure. Referring to FIG. 6E, the organic auxiliary cathode layer 20 in some embodiments is a unitary layer with a plurality of vias v extending through the organic auxiliary cathode layer 20. The plurality of vias v allow electrical connections between components in difference layers on two opposite sides of the organic auxiliary cathode layer 20. For example, a respective one of the plurality of vias v may allow a respective one of the plurality of anodes AD to extend through the organic auxiliary cathode layer 20 to connect with a drain electrode D of a respective one of the plurality of thin film transistors TFT.

Figure 8:
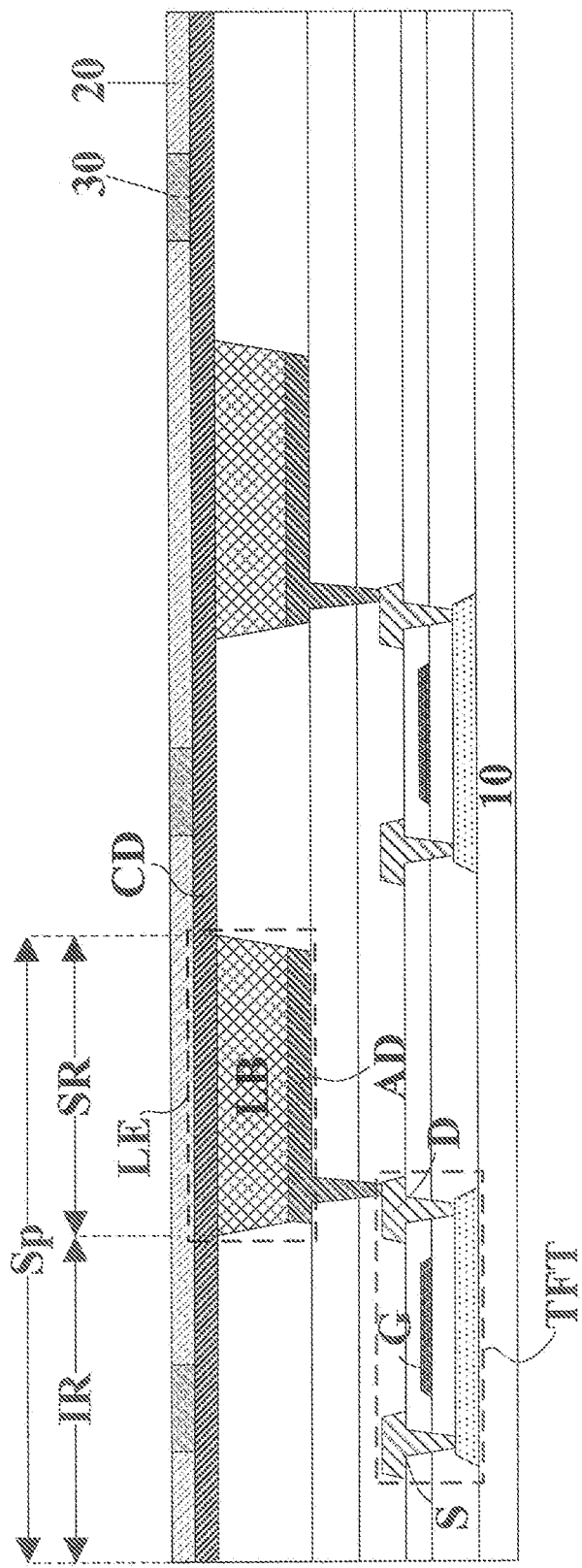
FIG. 8 is across-sectional view of a display substrate in some embodiments according to the present disclosure.

FIG. 8 is a cross-sectional view of a display substrate in some embodiments according to the present disclosure. Referring to FIG. 8, in some embodiments, the organic auxiliary cathode layer 20 and the metallic auxiliary cathode layer 30 are on a side of the unitary cathode layer CD away from the base substrate 10. Optionally, at least one of the organic auxiliary cathode layer 20 and the metallic auxiliary cathode layer 30 is in direct contact with the unitary cathode layer CD. As shown in FIG. 8, in some embodiments, each of the organic auxiliary cathode layer 20 and the metallic auxiliary cathode layer 30 is in direct contact with the unitary cathode layer CD. Optionally, the organic auxiliary cathode layer 20 and the metallic auxiliary cathode layer 30 are on a same plane of the unitary cathode layer CD.

Figure 9:
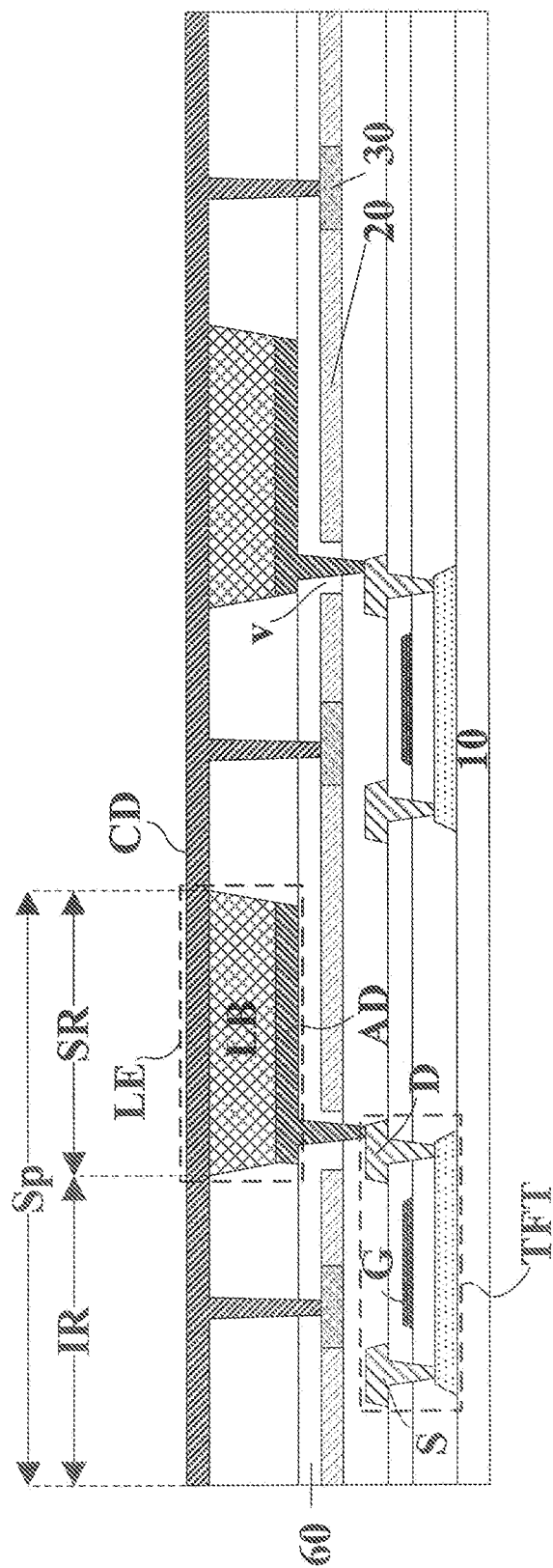
FIG. 9 is a cross-sectional view of a display substrate in some embodiments according to the present disclosure.

FIG. 9 is a cross-sectional view of a display substrate in some embodiments according to the present disclosure. Referring to FIG. 9, in some embodiments, the organic auxiliary cathode layer 20 and the metallic auxiliary cathode layer 30 are between the unitary cathode layer CD and the base substrate 10. Optionally, the unitary cathode layer CD extends through at least an insulating layer 60 between the unitary cathode layer CD and the metallic auxiliary cathode layer 30 to connect with the metallic auxiliary cathode layer 30. Optionally, the unitary cathode layer CD extends through at least the insulating layer 60 between the unitary cathode layer CD and the organic auxiliary cathode layer 20 to connect with the organic auxiliary cathode layer 20. Optionally, the unitary cathode layer CD is in direct contact with the metallic auxiliary cathode layer 30. Optionally, the unitary cathode layer CD is in direct contact with the organic auxiliary cathode layer 20.

In some embodiments, the display substrate includes a plurality of vias v extending through the organic auxiliary cathode layer 20. A respective one of the plurality of anodes AD extends through a respective one of the plurality of vias v to connect with a drain electrode D of a respective one of the plurality of thin film transistors TFT.

In some embodiments, the organic auxiliary cathode layer 20 is a substantially transparent layer. As used herein, the term "substantially transparent" means at least 50% (e.g., at least 60%, at least 70%, at least 80%, at least 90%, or at least 95%) of an incident light in the visible wavelength range transmitted therethrough.

Various appropriate light emitting elements may be used in the present display substrate. Examples of appropriate light emitting elements include organic light emitting diodes, quantum dots light emitting diodes, and micro light emitting diodes.

Various appropriate conductive materials may be used to make the organic auxiliary cathode layer 20.

Various appropriate conductive materials and various appropriate fabricating methods may be used for making the organic auxiliary cathode layer 20. For example, a conductive material may be deposited on the substrate (e.g., by sputtering, vapor deposition, solution coating, or spin coating); and patterned (e.g., by lithography such as a wet etching process) to form the organic auxiliary cathode layer 20. Examples of appropriate conductive materials for making the organic auxiliary cathode layer 20 include, but are not limited to, various organic conductive polymer materials. Optionally, the organic conductive polymer material is a polymer having a hydrophobic group. Examples of appropriate organic conductive polymer materials include polyacetylene, polythiophene, polypyrrole, polyaniline, polyphenylene, polyphenylene ethylene, and polydiacetylene.

Various appropriate conductive materials and various appropriate fabricating methods may be used for making the metallic auxiliary cathode layer 30. For example, a conductive material may be deposited on the substrate (e.g., by sputtering, vapor deposition, solution coating, or spin coating); and patterned (e.g., by lithography such as a wet etching process) to form the metallic auxiliary cathode layer 30. Examples of appropriate conductive materials for making the metallic auxiliary electrode layer 30 include, but are not limited to, various metal materials such as molybdenum, aluminum, silver, chromium, tungsten, titanium, tantalum, copper, and alloys or laminates containing the same. Optionally, the metallic auxiliary cathode layer 30 is made of nano-silver. Optionally, the metallic auxiliary cathode layer 30 is formed by ink-jet printing, imprinting, or screen printing.

Various appropriate materials and various appropriate fabricating methods may be used to make the anode layer. For example, a conductive material may be deposited by a plasma-enhanced chemical vapor deposition (PECVD) process or a sputtering process, e.g., a magnetron sputtering process. The deposited conductive material layer is then patterned, e.g., by a lithographic process. Examples of appropriate conductive materials for making the anode layer include, but are not limited to, various metal materials such as molybdenum, aluminum, silver, chromium, tungsten, titanium, tantalum, copper, and alloys or laminates containing the same; and various conductive metal oxides such as indium tin oxide.

In another aspect, the present disclosure provides a method of fabricating a display substrate. In some embodiments, the method includes forming a plurality of light emitting blocks on a base substrate, a respective one of the plurality of light emitting blocks formed in a subpixel region; forming a unitary cathode layer electrically connected to the plurality of light emitting blocks, the unitary cathode layer formed to extend substantially throughout a display area of the display substrate; forming an organic auxiliary cathode layer electrically connected to the unitary cathode layer, the organic auxiliary cathode layer formed to include an organic conductive polymer material; and forming a metallic auxiliary cathode layer limited in a groove defined by the organic auxiliary cathode layer and in direct contact with the organic auxiliary cathode layer and in direct contact with the unitary cathode layer. Optionally, the metallic auxiliary cathode layer is formed to be limited in an inter-subpixel region of the display substrate. Optionally, the organic auxiliary cathode layer is formed to be at least partially in the inter-subpixel region of the display substrate.

Optionally, the metallic auxiliary cathode layer is formed by ink-jet printing, imprinting, or screen printing.

Optionally, the metallic auxiliary cathode layer is formed to include a plurality of rows of electrode bars and a plurality of columns of electrode bars interconnected into a first network defining a plurality of first apertures, the respective one of the plurality of light emitting blocks formed in a respective one of the plurality of first apertures.

Optionally, the groove is formed to constitute a second network including a plurality rows of groove lines and a plurality of columns of groove lines interconnected into the second network, a boundary of the second network formed to define the plurality of first apertures.

Optionally, the organic auxiliary cathode layer is formed to include a plurality of organic blocks, a respective one of the plurality of organic blocks formed in the respective one of the plurality of first apertures, a periphery of the respective one of the plurality of organic blocks formed to be in direct contact with the metallic auxiliary cathode layer.

Optionally, the organic auxiliary cathode layer is formed as a unitary layer extending substantially throughout a display area of the display substrate. Optionally, the groove is formed to extend partially into the organic auxiliary cathode layer. Optionally, the plurality of organic blocks are formed to be connected to each other through a connecting base of the organic auxiliary cathode layer.

Optionally, the plurality of organic blocks are formed to be spaced apart from each other.

Optionally, a respective one of the plurality of organic blocks is formed as a ring structure defining a respective one of a plurality of second apertures. Optionally, the respective one of the plurality of light emitting blocks is formed in a respective one of the plurality of second apertures.

Optionally, the organic auxiliary cathode layer and the metallic auxiliary cathode layer are formed on a side of the unitary cathode layer away from the base substrate. Optionally, each of the organic auxiliary cathode layer and the metallic auxiliary cathode layer is formed to be in direct contact with the unitary cathode layer.

Optionally, the organic auxiliary cathode layer and the metallic auxiliary cathode layer are formed between the unitary cathode layer and the base substrate. Optionally, the unitary cathode layer is formed to extend through an insulating layer between the unitary cathode layer and the metallic auxiliary cathode layer to connect with the metallic auxiliary cathode layer.

Optionally, the organic auxiliary cathode layer is formed to be limited in the inter-subpixel region.

Optionally, the organic auxiliary cathode layer is formed partially in the inter-subpixel region and partially in the subpixel region.

Optionally, the organic auxiliary cathode layer is formed to span substantially throughout the subpixel region.

Optionally, the method further includes forming an insulating layer on the base substrate; and forming an anode layer comprising a plurality of anodes on a side of the insulating layer away from the base substrate, a respective one of the plurality of anodes formed to be connected to the respective one of the plurality of light emitting blocks in the subpixel region. Optionally, the organic auxiliary cathode layer and the metallic auxiliary cathode layer are formed on a side of the insulating layer away from the base substrate. Optionally, each of the anode layer, the organic auxiliary cathode layer, and the metallic auxiliary cathode layer is formed to be in direct contact with the insulating layer. Optionally, the anode layer, the organic auxiliary cathode layer, and the metallic auxiliary cathode layer are formed on a same plane of the insulating layer.

Figure 10A:
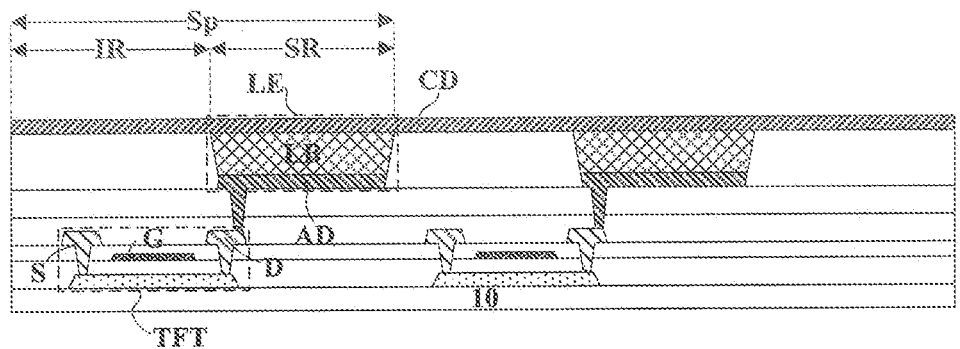
FIGS. 10A to 10D illustrate a method of fabricating a display substrate in some embodiments according to the present disclosure.
Figure 10B:
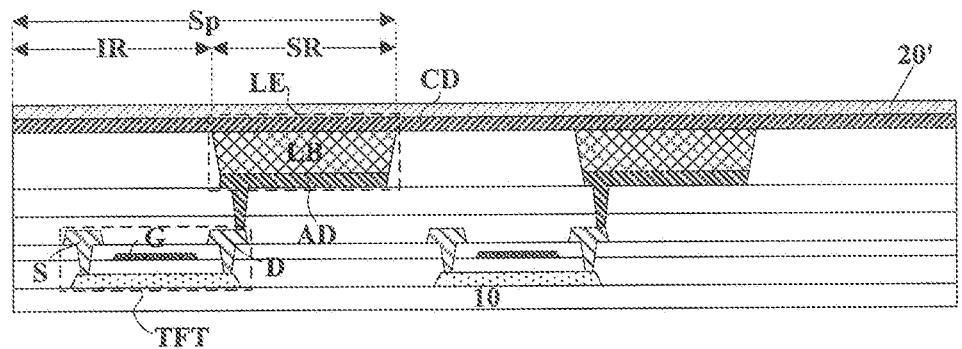
Figure 10C:
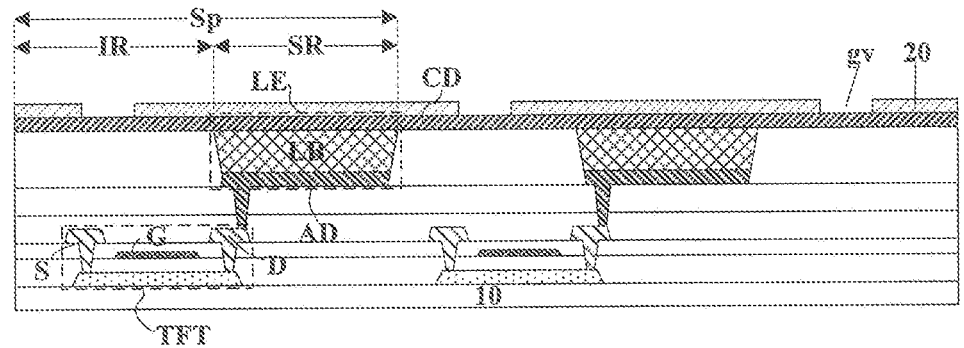
Figure 10D:
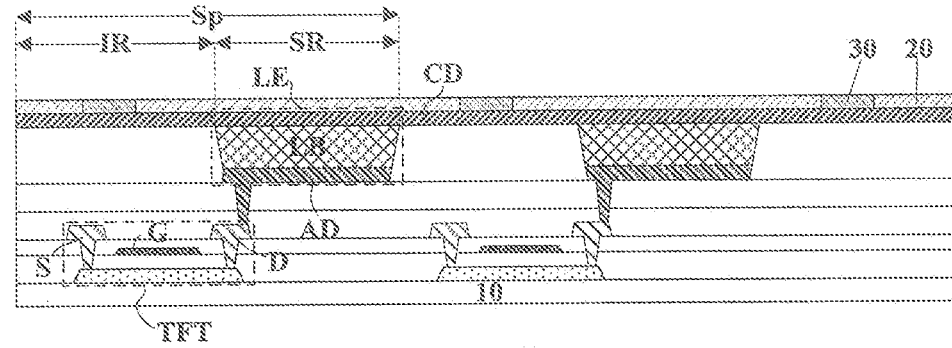

FIGS. 10A to 10D illustrate a method of fabricating a display substrate in some embodiments according to the present disclosure. Referring to FIG. 10A, a unitary cathode layer CD is formed to extend substantially throughout a display area of the display substrate. Referring to FIG. 10B, an organic conductive material layer 20' is formed on a side of the unitary cathode layer away from the base substrate 10. Referring to FIG. 10C, the organic conductive material layer 20' is patterned (e.g., by a lithography process) to form a groove gv extending at least partially into the organic conductive material layer 20', thereby forming an organic auxiliary cathode layer 20. Referring to FIG. 10D, a metallic material is filled in the groove gv, thereby forming a metallic auxiliary cathode layer 30. The metallic auxiliary cathode layer 30 is formed by, e.g., ink-jet printing, imprinting, or screen printing the metallic material into the groove gv.

In another aspect, the present disclosure provides a display apparatus including a display substrate described herein or fabricated by a method described herein, and one or more integrated circuits connected to the display substrate. Optionally, the display apparatus includes a display panel. Optionally, the display panel includes the display substrate described herein or fabricated by a method described herein, and a counter substrate. Examples of appropriate display apparatuses include, but are not limited to, an electronic paper, a mobile phone, a tablet computer, a television, a monitor, a notebook computer, a digital album, a GPS, etc. Optionally, the stretchable display apparatus further includes one or more integrated circuits connected to the stretchable display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
a base substrate;
a plurality of light emitting blocks on the base substrate, a respective one of the plurality of light emitting blocks in a subpixel region;
a unitary cathode layer electrically connected to the plurality of light emitting blocks, the unitary cathode layer extending substantially throughout a display area of the display substrate;
an organic auxiliary cathode layer electrically connected to the unitary cathode layer, the organic auxiliary cathode layer comprising an organic conductive polymer material; and
a metallic auxiliary cathode layer limited in a groove defined by the organic auxiliary cathode layer and in direct contact with the organic auxiliary cathode layer and in direct contact with the unitary cathode layer;
wherein the metallic auxiliary cathode layer is limited in an inter-subpixel region of the display substrate; and
the organic auxiliary cathode layer is at least partially in the inter-subpixel region of the display substrate.

2. The display substrate of claim 1, wherein the metallic auxiliary cathode layer comprises a plurality of rows of electrode bars and a plurality of columns of electrode bars interconnected into a first network defining a plurality of first apertures, the respective one of the plurality of light emitting blocks in a respective one of the plurality of first apertures.

3. The display substrate of claim 2, wherein the groove forms a second network comprising a plurality rows of groove lines and a plurality of columns of groove lines interconnected into the second network, a boundary of the second network defining the plurality of first apertures.

4. The display substrate of claim 2, wherein the organic auxiliary cathode layer comprises a plurality of organic blocks, a respective one of the plurality of organic blocks in the respective one of the plurality of first apertures, a periphery of the respective one of the plurality of organic blocks in direct contact with the metallic auxiliary cathode layer.

5. The display substrate of claim 4, wherein the organic auxiliary cathode layer is a unitary layer extending substantially throughout a display area of the display substrate;
the groove extends partially into the organic auxiliary cathode layer; and
the plurality of organic blocks are connected to each other through a connecting base of the organic auxiliary cathode layer.

6. The display substrate of claim 4, wherein the plurality of organic blocks are spaced apart from each other.

7. The display substrate of claim 5, wherein a respective one of the plurality of organic blocks has a ring structure defining a respective one of a plurality of second apertures; and
the respective one of the plurality of light emitting blocks in a respective one of the plurality of second apertures.

8. The display substrate of claim 1, wherein the organic auxiliary cathode layer and the metallic auxiliary cathode layer are on a side of the unitary cathode layer away from the base substrate; and
each of the organic auxiliary cathode layer and the metallic auxiliary cathode layer is in direct contact with the unitary cathode layer.

9. The display substrate of claim 1, wherein the organic auxiliary cathode layer and the metallic auxiliary cathode layer are between the unitary cathode layer and the base substrate; and
the unitary cathode layer extends through an insulating layer between the unitary cathode layer and the metallic auxiliary cathode layer to connect with the metallic auxiliary cathode layer.

10. The display substrate of claim 1, wherein the organic auxiliary cathode layer is limited in the inter-subpixel region.

11. The display substrate of claim 1, wherein the organic auxiliary cathode layer is partially in the inter-subpixel region and partially in the subpixel region.

12. The display substrate of claim 11, wherein the organic auxiliary cathode layer spans substantially throughout the subpixel region.

13. The display substrate of claim 1, further comprising:
an insulating layer on the base substrate; and
an anode layer comprising a plurality of anodes on a side of the insulating layer away from the base substrate, a respective one of the plurality of anodes connected to the respective one of the plurality of light emitting blocks in the subpixel region;
wherein the organic auxiliary cathode layer and the metallic auxiliary cathode layer are on a side of the insulating layer away from the base substrate;
each of the anode layer, the organic auxiliary cathode layer, and the metallic auxiliary cathode layer is in direct contact with the insulating layer; and
the anode layer, the organic auxiliary cathode layer, and the metallic auxiliary cathode layer are on a same plane of the insulating layer.

14. The display substrate of claim 1, wherein the organic auxiliary cathode layer is a substantially transparent layer.

15. The display substrate of claim 1, wherein the organic conductive polymer material comprises a polymer comprising a hydrophobic group.

16. The display substrate of claim 1, wherein the organic conductive polymer material is selected from a group consisting of polyacetylene, polythiophene, polypyrrole, polyaniline, polyphenylene, polyphenylene ethylene, and polydiacetylene.

17. The display substrate of claim 1, wherein the metallic auxiliary cathode layer comprises nano-silver.

18. A display apparatus, comprising the display substrate of claim 1, and one or more integrated circuits connected to the display substrate.

19. A method of fabricating a display substrate, comprising:
forming a plurality of light emitting blocks on a base substrate, a respective one of the plurality of light emitting blocks formed in a subpixel region;

forming a unitary cathode layer electrically connected to the plurality of light emitting blocks, the unitary cathode layer formed to extend substantially throughout a display area of the display substrate;

forming an organic auxiliary cathode layer electrically connected to the unitary cathode layer, the organic auxiliary cathode layer formed to comprise an organic conductive polymer material; and forming a metallic auxiliary cathode layer limited in a groove defined by the organic auxiliary cathode layer and in direct contact with the organic auxiliary cathode layer and in direct contact with the unitary cathode layer;

wherein the metallic auxiliary cathode layer is formed to be limited in an inter-subpixel region of the display substrate; and the organic auxiliary cathode layer is formed to be at least partially in the inter-subpixel region of the display substrate.

20. The method of claim 19, wherein the metallic auxiliary cathode layer is formed by ink-jet printing, imprinting, or screen printing.

\* \* \* \* \*